United States Patent [19]

Allen

[11] 4,264,705
[45] Apr. 28, 1981

[54] MULTILAYERED ELASTOMERIC PRINTING PLATE

[75] Inventor: Richard B. Allen, Waterbury, Conn.

[73] Assignee: Uniroyal, Inc., New York, N.Y.

[21] Appl. No.: 106,602

[22] Filed: Dec. 26, 1979

[51] Int. Cl.³ .............................................. G03C 1/68
[52] U.S. Cl. .................................. 430/271; 430/281; 430/286; 430/288; 430/302; 430/502
[58] Field of Search ............... 430/271, 281, 286, 288, 430/302, 502

[56] References Cited

U.S. PATENT DOCUMENTS

| | | | |
|---|---|---|---|
| 3,024,180 | 3/1962 | McGraw | 430/286 |
| 3,674,486 | 7/1972 | Milgrom | 430/286 |
| 3,894,873 | 7/1975 | Kobayashi et al. | 430/286 |
| 3,948,665 | 4/1976 | Richter et al. | 430/281 |
| 4,045,231 | 8/1977 | Toda et al. | 430/286 |
| 4,162,919 | 7/1979 | Richter et al. | 430/286 |

*Primary Examiner*—Jack P. Brammer
*Attorney, Agent, or Firm*—Thomas A. Beck

[57] ABSTRACT

This invention relates to a multilayered printing plate consisting of (1) a photosensitive printing layer comprising an elastomeric polymer, an ethylenically unsaturated monomer and a photoinitiator, (2) an elastomeric backing layer which is partially photocured and made from a vinyl terminated prepolymer containing a photoinitiator and (3) an optional supporting layer. The multilayer structure is useful for flexographic printing.

24 Claims, No Drawings

MULTILAYERED ELASTOMERIC PRINTING PLATE

SUMMARY OF INVENTION

This invention relates to a multilayered printing plate consisting of (1) a photosensitive printing layer comprising an elastomeric polymer, an ethylenically unsaturated monomer and a photoinitiator, (2) a elastomeric backing layer which is partially photocured and made from a vinyl terminated prepolymer containing a photoinitiator and (3) an optional supporting layer. The multilayer structure is useful for flexographic printing.

PRIOR ART

U.S. Pat. No. 3,024,180 discloses a one-layer flexible photopolymer printing plate made from 1,3-butadiene derivatives, an acrylate monomer and a photoinitiator.

U.S. Pat. No. 3,674,486 discloses a one-layer flexible photopolymer printing plate made from block copolymers of styrene and polybutadiene or polyisoprene.

U.S. Pat. No. 3,948,665, U.S. Pat. No. 4,162,919 and British Pat. No. 1,454,191 disclose multilayered constructions containing a specific composition for the photosensitive layer and a non-photosensitive urethane or other type elastomers for the backing layer or intermediate layer.

DESCRIPTION OF INVENTION

Flexography is a method to print flexible materials such as paper, plastic films and metal foils or to print irregular surfaced material such as corrugated board. In recent years photopolymer flexographic printing plates have become increasingly accepted in the industry because they are quicker and less costly to make than conventional molded rubber plates which are prepared by vulcanizing rubber in a mold under high temperature and pressure.

Most photopolymer flexographic plates, such as those described in U.S. Pat. Nos. 3,024,180 or 3,674,486, contain an elastomeric binder, ethylenically unsaturated monomer and a photoinitiator. These systems are all processed in a similar fashion which is to expose the presensitized elastomeric plate with ultraviolet light through a negative transparency. Addition polymerization occurs selectively in the exposed areas which corresponds to the clear areas of the transparency, and substantially no polymerization occurs in unexposed areas which correspond to the opaque areas of the transparency. A relief image is produced when the plate is developed by brushing in a solvent. The system is designed so that the developing solvent dissolves the unexposed, unpolymerized areas and does not dissolve the exposed, polymerized areas.

Unfortunately, these photopolymer flexographic plates are not ideal for all printing applications because large amounts of liquid ethylenically unsaturated multifunctional monomer must be added to the formulation to assure that the exposed areas crosslink to a high enough level to render them insoluble in the developing fluid. The high levels of monomer plasticize the printing plate in the unexposed state causing it to cold flow and change thickness. In the exposed state the high levels of monomer cause the plate to be very hard and thus it may not readily conform to the non-uniform surface of some printing materials such as corrugated board.

U.S. Pat. Nos. 3,948,665, and 4,162,919 and British Pat. No. 1,454,191 describe multilayer flexographic printing plates containing a photocrosslinkable printing layer, a non-photocrosslinkable intermediate layer (or backing layer) and a support (or stabilizing layer). The intermediate (or backing) layer is of lower hardness than the printing layer and allows the plate to conform better to irregular surface material.

In practice however, printers have to print a variety of materials and the optimum hardness of the backing layer to achieve the best print quality depends on many factors such as press speed, press pressure and surface smoothness of the material to be printed. Often harder backing material gives better print quality than soft backing material since the plate has less tendency to deform from shear forces developed during high speed printing. For these reasons, the printer needs to be able to adjust the hardness of the backing layer to suit has printing needs. This is not possible with the multilayered system described in U.S. Pat. No. 3,948,665, U.S. Pat. No. 4,162,919 and British Pat. No. 1,454,191 since they use a fully cured non-polymerizable intermediate or backing layer. This invention describes a multilayered printing plate construction consisting of:

(1) a photosensitive printing layer comprising an elastomeric polymer, an ethylenically unsaturated monomer and a photoinitiator, (2) a partially cured elastomeric backing layer made from a vinyl terminated prepolymer having a molecular weight of from about 500 to about 10,000 and a photoinitiator, and (3) an optional support.

This invention has all the advantages of the multilayered printing system described in U.S. Pat. No. 3,948,665, U.S. Pat. No. 4,162,919 and British Pat. No. 1,454,191 but in addition, the backing layer hardness can be adjusted by the printer by simple back exposure to give optimum printing properties.

There are no unreacted liquid components in the backing layer of this invention so that backing layer can be made soft with no cold flow normally associated with a one layer photopolymer plate such as those mentioned in the prior art.

The photopolymerizable printing layer of the present invention comprises at least 40% by weight of an elastomeric polymer and at least 5% by weight of an addition-photopolymerizable polyunsaturated acrylic or methacrylic acid ester, and small amounts, i.e., from 0.1 to 10% by weight of the total composition, of an addition polymerization initiator which can be activated by actinic light.

The elastomeric polymers useful in the invention are particularly those derived from 1,3-butadiene including the hydrocarbon and halohydrocarbon-substituted butadienes, and copolymers of the 1,3-butadienes with aryl olefins, e.g., styrene, divinyl benzene or acrylic, -alkacrylic, or -haloacrylic acids or the corresponding esters or nitriles. Block copolymers of styrene/butadiene or styrene/isoprene are also useful as well as the chlorinated polyethylene elastomeric polymers. Suitable 1,3-butadiene and hydrocarbon and halogen-substituted 1,3-butadiene monomers include 1,3-butadiene, 2-methyl-1,3-butadiene, 2,3-dimethyl-1,3-butadiene, 2-ethyl-1,3-butadiene, 2-isopropyl-1,3-butadiene, 2-chloro-1,3-butadiene and 2-fluoro-1,3-butadiene wherein the butadiene component is present in the copolymer in an amount of from 40% to 100% by weight. Additionally, polymers such as chlorosulfonated polyethylene, polypropylene oxide, epihalohydrins or ethylene propylene copolymers and terpolymers may be used.

Photopolymerizable ethylenically unsaturated crosslinking agents suitable for use in the invention include unsaturated esters of polyols, particularly such esters with alpha-methylene carboxylic acids, e.g. ethylene glycol diacrylate, diethylene glycol diacrylate, triethylene glycol diacrylate, tetraethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,2,5-butanetriol trimethacrylate, 1,4-butanediol diacrylate and dimethacrylate 1,4-cyclohexanediol diacrylate, 1,4-benzenediol dimethacrylate, isosorbidene diacrylate, pentaerythritol di-, tri-, and tetra-methacrylate, dipentaerythritol polyacrylate, pentaerythritol di-, tri-, and tetracrylates, 1,3-propanediol diacrylate, 1,6 hexanediol diacrylate and dimethacrylate, 1,5-pentanediol dimethacrylate, trimethylolpropane triacrylate, the bisacrylates and methacrylates of polyethylene glycols of molecular weight 200 to 4000; unsaturated amides, particularly those of the alpha-methylene carboxylic acids, and especially those of alpha, omega-diamines and oxygen-interrupted omega-diamines such as methylene bisacrylamide, methylene bis-methacrylamide, ethylene bis-methacrylamide, 1,6-hexamethylene bis-acrylamide, diethylene triamine tris-methacrylamide, 1,2-di(gamma-methacrylamidopropoxy)ethane, beta-methacrylamidoethyl methacrylate, N-(beta-hydroxyethyl)-2-(methacrylamido) ethyl acrylate and N,N-bis(beta-methacrylyloxyethyl)-acrylamide; vinyl esters such as divinyl succinate, divinyl adipate, divinyl phthalate, divinyl terephthalate, divinyl benzene-1,3-disulfonate, divinyl butane-1, 4-disulfonate and unsaturated aldehydes, such as sorbaldehyde (hexadienal). An outstanding class of those preferred addition polymerizable crosslinking agents are the esters and amides of alpha-methylene carboxylic acids and substituted carboxylic acids with polyols and polyamines wherein the molecular chain between the hydroxyls and amino groups is solely carbon or oxygen-interrupted carbon.

The useful addition polymerization and/or crosslinking initiators are those activatable by actinic light and thermally inactive at and below 185° C. These include aromatic ketones such as benzophenone and substituted benzophenones, the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tertbutylanthraquinone, octamethylanthraquinone 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone 2-phenylanthraquinone, 2,3-diphenylanthraquinone, sodium salt of anthraquinone, alpha-sulfonic acid, 3-chloro-2-methylanthraquinone, retenequinone, 7,8,9,10-tetrahydronaphthacenequinone, and 1,2,3,4-tetrahydrobenz (a) anthracene-7,12-dione. Other photoinitiators which are also useful are described in U.S. Pat. No. 2,760,863 and include vicinal ketaldonyl compounds, such as diacetyl, benzil, etc.; α-ketaldonyl alcohols, such as benzoin, pivaloin etc., acryloin ethers, e.g. benzoin methyl and ethyl ethers, etc., α-hydrocarbon substituted aromatic acyloins, including α-methylbenzoin, α-allybenzoin and α-phenylbenzoin and 2,2 dialkoxy-2-phenylacetophenone.

As a preferred embodiment, the photopolymerizable layer comprises (1) from about 60% to about 95% by weight of nitrile rubber, (2) from about 40% to about 5% by weight of trimethylolpropane triacrylate and/or, trimethylpropane trimethacrylate, and (3) from about 0.5% to about 4.0% by weight of benzophenone.

The method of mixing the photosensitive composition is not critical, and does not constitute part of the invention. It has been found that optimum homogeneity results when the addition polymerization initiator is combined with the di-, tri-, or tetra-unsaturated acrylic or methacrylic acid ester prior to incorporation into the elastomeric polymer. The resultant polymerizable compositions may be in a form of a liquid solution, liquid dispersion, or as a solid mix. The liquid solution or liquid dispersion may be cast directly upon the partially photocured backing layer, or first cast upon a suitable wheel or belt, stripped, and then affixed to the surface of the backing layer. The solid mix may be extruded or calendered directly upon the backing layer or formed as a self-supporting sheet and then affixed to the surface of the backing layer. For example, solutions and dispersions of the photopolymerizable compositions can be made with such solvents as chlorinated hydrocarbons, e.g. chloroform, carbon tetrachloride, trichloroethylene and chlorotoluene, ketones, e.g., methyl ethyl ketone, diethyl ketone and methyl isobutyl ketone; organic esters, e.g. ethyl acetate and blends thereof of such solvents. On the other hand, solid mixes may be prepared by mixing the components on a mill or in an internal mixer such as a Banbury.

The preferred prepolymers used for the backing layer are the urethane type and are prepared by reacting a polyether or polyester polyol having 2 or 3 hydroxyls with a diisocyanate and a hydroxy alkyl acrylate or methacrylate. A second class of prepolymers that can be used for the backing layer are the vinyl terminated butadiene-acrylonitrile or vinyl terminated butadiene prepolymers such as those offered under the tradename Hycar.

For the urethane type prepolymers suitable ether backbones are polyoxyalkylene polyols where the alkylene group contains two to four carbon atoms and the polyol has two to three hydroxyl groups per molecule. Examples are polyoxyethylene diol or triol, polyoxypropylene diol or triol, a random or block copolymer of propylene oxide and ethylene oxide containing two to three terminal hydroxyls or polyoxybutylene diol or triol.

Suitable polyester polyols can be produced from the condensation of saturated dibasic acids to 4 to 12 carbon atoms in the alphatic moiety such as succinic acid, adipic acid and dodecanedicarboxylic acid with an aliphatic diol or a mixture of aliphatic diols of 2 to 10 carbon atoms such as ethylene glycol and/or butylene glycol.

With either the ether or the ester polyols, the average molecular weight of the polyol segment can be 500 to 10,000 and preferably 1,000 to 5,000.

The diisocyanates used in the preparation of the urethane type backing layer can be aromatic, aliphatic or cycloaliphatic. Examples are 2,4-tolylene diisocyanate, 2,6-tolylene diisocyanate, p-phenylenediisocyanate, m-phenylene diisocyanate, biphenylene diisocyanate, 4,4-methylene-bis(phenylisocyanate), isophorone diisocyanate, trimethyl hexamethylene diisocyanate, 1,4-tetramethylene diisocyanate and 1,4 cyclohexylene diisocyanate. Two or more diisocyanates may also be used together.

Vinyl termination is introduced into the prepolymer by way of hydroxy acrylate esters such as: 2-hydroxyethyl acrylate or methacrylate, 2-hydroxypropyl acrylate or methacrylate, 3-bromo-2-hydroxypropyl acrylate or methacrylate, 3-chloro-2-hydroxypropyl acrylate or methacrylate, 4-hydroxy-n-butyl acrylate or methacrylate, diethylene glycol monoacrylate or monomethacrylate, dipropylene glycol monoacrylate or monomethacrylate, dibutylene glycol monoacrylate or monomethacrylate, tetrasethylene glycol monacrylate or monomethacrylate, monoacrylates or monomethacrylates of polyoxyethylene diols having a number average molecular weight of about 200 to 1,200 and monomethacrylate of polyoxybutylene diols having a number average molecular weight of about 200 to 1,500.

When the urethane prepolymer is prepared, a small amount of the hydroxyacrylate can be replaced by an approximately equal molar amount of monofunctional alcohol in order to soften the resultant photocured rubber. Preferred alcohols are the aliphatic type and contain one to twenty carbon atoms.

Various reactive ingredients can be mixed with the vinyl terminated prepolymer to alter the properties of the resultant photocured rubber. Monofunctional vinyl compounds can be added in amounts up to 50% of the urethane weight to reduce the viscosity or alter the physical or chemical properties of the partially cured rubber. Examples of suitable monofunctional vinyl compounds are alkyl acrylates and methacrylates wherein the alkyl group contains up to twenty carbon atoms such as ethyl hexyl acrylate and methacrylate, ethoxy ethyl acrylate or methacrylate, phenoxyethyl acrylate or methacrylate, tetra hydroxyfurfuryl acrylate and methacrylate, benzyl acrylate and methacrylate, n-isobutymethyl acrylamide, n-vinyl-2-pyrrolidone, styrene and -methylstryene.

It is understood that these modifying ingredients are reactive and are incorporated into the elastomeric backing layer matrix during partial photocuring rendering them substantially non-migratory and non-plasticizing.

Further modification of the physical or chemical properties of the partial cured backing layer can come from mixng chain transfer agents such as mono, di, and tetra functional mercapto compounds with the vinyl terminated prepolymers. The mercapto compounds can be added at levels from 0.01% to 10% of the total formulation weight. Examples of suitable mercapto compounds are thioglycolic acid, 2,2-dimercaptodiethyl ether, trimethylolpropane trithioglycolate, pentaerithritol tetrathioglycolate, ethylene bis (3-pentaerithritol) tetrathioglycolate, ethylene bis (3-mercaptopropionate) and tri-methylolpropane tri-3-mercaptopropionate. High boiling thiols are preferred because they have a less offensive odor. The preferred level of thiols is 0.2 to 5%.

A necessary ingredient of the backing layer formulation is a photoinitiator. The photoinitiators mentioned previously as suitable for the printing layer are also suitable for use in the backing layer. The support (or stabilizing layer) can be any durable and flexible film such as polyester or nylon. The support may be below the backing layer or between the backing and printing layers.

The photocurable backing layer is prepared by heating the vinyl terminated prepolymer to about 70° C. In an oven or on a hotplate. The photoinitiator and modifying ingredients such as monofunctional vinyl compounds and mono or polyfunctional thiols are then added with stirring until all materials are well mixed. The mixture is briefly degassed and applied to a 5 mil thick polyester film by coating with a doctor blade or by pouring the hot prepolymer mixture directly into a mold. The prepolymer is cured to a hardness of about 30 to 90 Shore A by exposing the composition in an ultraviolet exposure unit. The time of the exposure is dependent upon the hardness desired, the thickness of the composition, the type and level of photoinitiator and the intensity of the ultraviolet light source.

The following examples further illustrate the preparation of the multilayered printing plate of this invention.

EXAMPLE 1

This example demonstrates the preparation of a multilayered plate which uses a backing layer made from a commercially available isocyanate-tipped urethane prepolymer. To make the backing layer, 100 parts of a isocyanate-tipped urethane prepolymer called vibrathane 6001 is heated to 80° C. in a suitable reaction vessel. Vibrathane 6001 is a MDI tipped polyester prepolymer with an amine equivalent of about 1250; manufactured by Uniroyal Chemical Co. To the prepolymer, 8.85 parts of 2-hydroxyethylacrylate, 0.6 parts of 1-octanol and 0.04 parts of triethylene diamine are added and the mixture is stirred for 1 hour at 80° C. in air. The photoinitiator, 1,7 parts of 2,2-dimethoxy-2-phenylacetophenone, is then added with stirring for 15 minutes. The material is coated on a 5 mil thick polyester film with a doctor blade in two 0.020" passes. After each pass the prepolymer backing layer is partially photocured to a Shore A hardness of about 40 by irradiation on an exposure unit containing a series of low pressure mercury UV sources.

To make the relief or printing layer, a cement is made by dissolving 100 parts of a butadiene-acrylonitrile rubber containing 29.5% acrylonitrile, 20 parts trimethylolpropane triacrylate and 1.5 parts benzophenone in 250 parts toluene and 90 parts methyl ethyl ketone with stirring. The cement was coated on 0.005" thick release coated polyester film with a doctor blade, applying a 0.002" coat per pass to give a total dry thickness of 0.035". The coating is placed in a 130° F. oven for approximately one day to remove the residual solvent.

The backing layer described above, is dipped in toluene to aid adhesion, then laminated at room temperature to the relief (or printing) layer described above. The composite structure is kept at room temperature for several days then exposed through a lithographic negative for 14 minutes on a UV exposure unit. The plate is then developed for 15 minutes in a brush-out unit using perchloroethylene solvent followed by drying in a forced air oven for 20 minutes at 160° F. The finished multilayered printing plate, which consisted of a 0.005" polyester support, a 0.032" backing layer and a 0.030" photopolymer layer, had good image quality and a relief depth of 0.030".

EXAMPLE 2

This example demonstrates the preparation of a backing layer based on a vinyl terminated nitrile prepolymer. About 60 grams of Hycar VTBN 300X14 is heated to 70° C. and 1.2 grams of 2,2-dimethoxy-2- phenylacetophenone is added with stirring until dissolved. The liquid mixture is briefly degassed and poured into a 4×5×0.25" mold lined with 0.005" thick polyester film. The material is exposed to about a 50 Shore A hardness on the UV exposure unit.

The backing layer was laminated to the printing layer as described in Example 1. The resultant multiple layer printing plate was exposed 14 minutes on the UV exposure unit and developed for 15 min. in a brushout unit containing perchloroethylene solvent. The dried plate had good image and a relief depth of about 0.030". The hardness of the backing layer could be raised to above 90 Shore A hardness with additional back exposure.

Note: The Hycar polymer used is a vinyl terminated butadiene-acrylonitrile oligomer having 16.5% acrylonitrile, a specific gravity of 0.962 and a viscosity of 200,000 cp at 27° C. manufactured by B. F. Goodrich Chemical Co.

EXAMPLE 3

This example demonstrates the preparation of a multilayered printing plate which uses a backing layer made from a polyether polyol.

About 205 parts of an ethylene oxide tipped copolymer of ethylene oxide and propylene oxide having an average molecular weight of about 2000 is added to a reaction flask. The polyether polyol is heated to about 100° C. and degassed for about 1 hour. The material is cooled to around 75° and 34.8 parts of toluene diisocyanate is added. The reaction is held at about 80° C. for 2 hours under nitrogen. Then 23.2 parts of 2-hydroxyethylacrylate is added along with 0.005 parts of dibutyl tin dilaurate catalyst and 0.3 parts of 1-octanol. The reaction is held at 80° C. for 2 hours with stirring in air.

This mixture is cooled to about room temperature and 40 parts is mixed with 10 parts N-vinyl-2-pyrrolidone, 1.25 parts of trimethylpropane tri-3-mercaptopropionate and 0.75 parts of 2,2-dimethoxy-2-phenylacetophenone. This mixture is degassed briefly and coated on 0.005" polyester using two passes with 0.020" doctor blade. The material is exposed to a Shore A hardnes of 35 after each pass.

To this backing, the relief layer is applied as in Example 1. After face exposure and development, the multilayered plate had excellent image, good flex strength and a relief depth of about 0.030". The backing layer hardness could be further adjusted to give a Shore A hardness of over 60 by additional back exposure.

EXAMPLE 4

A vinyl terminated prepolymer was made by the procedure described in Example 3 except that 200 parts of a 3000 MW ethylene-propylene adipate polyol (having a 70/30 ethylene-propylene ratio), 23 parts of a toluene diisocyanate, 15.5 parts of 2-hydroxyethyl acrylate; 0.3 parts of 1-octanol and 3.6 parts of 2,2-dimethyoxy-2-phenylacetophenone was used.

The relief layer was laminated similarly as in Example 1 except in this case a thin coat of a 50% solution of Vibrathane 6001 in toluene was applied to the backing layer with a paint brush to improve the adhesion between layers. The processed plate had good image quality and a relief depth of about 0.020". The backing layer hardness could be raised to over 80 with additional back exposure.

What I claim and desire to protect by Letters Patent is:

1. A multilayered article suitable for processing to form a flexographic printing plate comprising (A) a first layer comprising in admixture at least 40% of an elastomeric polymer, at least 5% of an addition polymerizable ethylenically unsaturated monomer and from 0.1 to 10% by weight of a photoinitiator activatable by actinic radiation and (B) a second elastomeric backing layer comprising the reaction product resulting from partially photocuring a vinyl terminated prepolymer having a molecular weight of from about 500 to about 10,000 in the presence of a photoinitiator activatable by actinic radiation, said reaction product having a hardness of about 30 to 90 Shore A.

2. The multilayered article defined in claim 1 wherein the elastomeric polymer is selected from the group consisting of polybutadiene, hydrocarbon substituted polybutadiene, halohydrocarbon substituted polybutadiene, copolymers of butadiene and acrylonitrile, the block copolymer of stryene and butadiene and acrylonitrile, the block copolymer of stryene and isoprene, chlorinated polyethylene, chlorosulfonated polyethylene and natural rubber.

3. The multilayered article defined in claim 1 wherein the ethylenically unsaturated monomer is selected from the group consisting of ethylene glycol diacrylate, ethylene glycol dimethacrylate, diethylene glycol diacrylate, diethylene glycol dimethacrylate, 1,4-butanediol dicrylate, 1,4-butanediol dimethacrylate, 1,6-hexanediol diacrylate, 1,6-hexanediol dimethacrylate, trimethylolpropane triacrylate, trimethylolpropane trimethacrylate, or blends thereof.

4. The mulfilayered article defined in claim 1 wherein the photoinitiator activatable by actinic radiation is selected from the group consisiting of benzophenone, the $C_1-C_5$ alkyl ethers of benzoin, benzil, the $C_1-C_5$ alkyl monoketals of benzil, and 2,2-dimethoxy-2-phenylacetophenone.

5. The multilayered article defined in claim 1 wherein the elastomeric polymer is selected from the group consisting of polybutadiene, hydrocarbon substituted polybutadiene, halohydrocarbon substituted polybutadiene, copolymers of butadiene and acrylonitrile, the block copolymer of styrene and isoprene, chlorinated polyethylene, chlorosulfonated polyethylene and natural rubber, the ethylenically unsaturated monomer is present in the range of from 5% to 40% by weight and is selected from the group consisting of ethylene glycol diacrylate, diethylene glycol dimethacrylate, 1,4-butanediol diacrylate, 1,4-butanediol dimethacrylate, trimethylolpropane triacrylate, trimethylolpropane trimethacrylate, or blends thereof; and the photoinitiator activatable by actinic radiation is present in the amount of from 0.5% to 4% by weight and is selected from the group consisting of benzophenone, the $C_1-C_5$ alkyl ethers of benzoin, benzil, the $C_1-C_5$ alkyl monoketals of benzil, and 2,2-dimethoxy-2-phenylacetophenone.

6. The multilayered article defined in claim 1 wherein the prepolymer is (a) selected from the group consisting of the reaction product of a polyether polyol or a polyester polyol having at least two hydroxyl groups with a diisocyanate and a hydroxy alkyl acrylate ester of hydroxy alkyl methacrylate esters, or (b) a vinyl terminated copolymer of butadiene and acrylonitrile.

7. The multilayered article defined in claim 6 wherein the polyether polyol is selected from the group consisting of polyoxyethylene diol, polyoxyethylene triol, polyoxypropylene diol, polyoxypropylene triol, polyoxybutylene diol, polyoxybutylene triol, random or block copolymers of propylene oxide and ethylene oxide containing at least 2 terminal hydroxy groups.

8. The multilayered article defined in claim 6 wherein the polyester polyol is the reaction product of a saturated dibasic acid having 4 to 12 carbon atoms in the aliphatic moiety with an aliphatic siol or a mixture thereof.

9. The multilayered article defined in claim 6 wherein the diisocyanate is selected from the group consisting of 2,4-tolylene diisocyanate, 2,6-tolylene diisocyanate, p-phenylenediisocyanate, m-phenylene diisocyanate, biphenylene diisocyanate, 4,4-methylene-bis(phenyl-isocyanate) (MDI) isophorone diisocyanate, trimethyl 1 hexamethylene diisocyanate, 1,4-tetramethylene diisocyanate and 1,4 cyclohexylene diisocyanate or mixtures thereof.

10. The multilayered article defined in claim 6 wherein the hydroxy alkyl acrylate or methacrylate esters are selected from group consisting of 2-hydroxyethyl acrylate or methacrylate, 2hydroxypropyl acrylate or methacrylate, 3-bromo-2-hydroxypropyl acrylate or methacrylate 3-chloro-2-hydroxypropyl acrylate or methacrylate, 4-hydroxy-n-butyl acrylate or methacrylate, diethylene glycol monoacrylate or monomethacrylate, dipropylene glycol monoacrylate or monomethacrylate, dibutylene glycol monoacrylate or monomethacrylate, tetraethylene glycol monoacrylate or monomethacrylate, monoacrylates or monomethacrylates of polyoxyethylene diols having a number average molecular weight of about 200 to 1,200 and monomethacrylate of polyoxybutylene diols having a number average molecular weight of about 200 to 1,500.

11. The multilayered article defined in claim 6 wherein the prepolymer is blended with property altering amounts of mono functional vinyl compound selected from the group consisting of ethyl hexyl acrylate and methacrylate, ethoxy ethyl acrylate or methacrylate, phenoxyethyl acrylate or methacrylate, tetra hydroxyfurfuryl acrylate and methacrylate, benzyl acrylate and methacrylate, n-isobutymethyl acrylamide, n-vinyl-2-pyrrolidone, styrene and -methylstyrene.

12. The multilayered article defined in claim 6 wherein the prepolymer is blended with property altering amounts of mono, di and tetra functional mercapto compounds selected from the group consisting of thioglycolic acid, 2,2-dimercaptodiethyl ether, trimethylolpropane trithioglycolate, pentaerithritol ether, ethylene bis(3-pentaerithritol)-tetrathioglycolate, ethylene bis (3-mercaptopropionate) and trimethylol-propane tri-3-mercaptopropionate.

13. The multilayered article defined in claim 5 wherein the partially photocured prepolymer possesses a Shore A hardness of from 30 to 90 and the prepolymer is (a) selected from the group consisting of the reaction product of a polyether polyol or a polyester polyol having at least two hydroxyl groups with a diisocyanate and hydroxy alkyl acrylate ester or hydroxy alkyl methacrylate esters, or (b) a vinyl terminated copolymer of butadiene and acrylonitrile.

14. The multilayered article defined in claim 13 wherein the polyether polyol is selected from the group consisting of polyoxyethylene diol, polyoxyethylene triol, polyoxypropylene diol, polyoxypropylene triol, polyoxybutylene diol, polyoxybutylene triol, random or block copolymers of propylene oxide and ethylene oxide containing at least 2 terminal hydroxy groups.

15. The multilayered article defined in claim 13 wherein the polyester polyol is the reaction product of a saturated dibasic acid having 4 to 12 carbon atoms in the aliphatic moiety with an aliphatic diol or a mixture thereof.

16. The multilayered article defined in claim 13 wherein the average molecular weight of the polyol segment is between about 500 and 10,000.

17. The multilayered article defined in claim 13 wherein the diisocyanate is selected from the group consisting of 2,4-tolylene siisocyanate, 2,6-tolylene diisocyanate, p-phenylenediisocyanate, m-phenylene diisocyanate, biphenylene diisocyanate, 4,4-methylenebis(phenyl-isocyanate), isophorone diisocyanate, trimethyl hexamethylene diisocyanate, 1,4-tetramethylene diisocyanate and 1,4 cyclohexylene diisocyanate or mixtures thereof.

18. The multilayered article defined in claim 13 wherein the hydroxy alkyl acrylate or methacrylate esters are selected from the group consisting of 2-hydroxyethyl acrylate or methacrylate, 2-hydroxy-propyl acrylate or methacrylate, 3-bromo-2-hydroxypropyl acrylate or methacrylate, 3-chloro-2-hydroxypropyl acrylate or methacrylate, 4-hydroxy-n-butyl acrylate or methacrylate, diethylene glycol monoacrylate or monomethacrylate, dipropylene glycol monoacrylate or monomethacrylate, dibutylene glycol monoacrylate or monomethacrylate, tetraethylene glycol monoacrylate or monomethacrylate, monoacrylates or monomethacrylates of polyoxyethylene diols having a number average molecular weight of about 200 to 1,200 and monomethacrylate of polyoxybutylene diols having a number average molecular weight of about 200 to 1,500.

19. The multilayered article defined in claim 13 wherein the prepolymer is blended with property altering amounts of mono functional vinyl compound selected from the group consisting of ethyl hexyl acrylate and methacrylate, ethoxy ethyl acrylate or methacrylate, phenoxyethyl acrylate or methacrylate, tetra hydroxyfurfuryl acrylate and methacrylate, benzyl acrylate and methacrylate, n-isobutymethyl acrylamide, n-vinyl-2-pyrrolidone, styrene and -methylstyrene.

20. The multilayered article defined in claim 13 wherein the prepolymer is blended with property altering amounts of mono, di and tetra functional mercapto compounds selected from the group consisting of thioglycolic acid, 2,2-dimercaptodiethyl ether, trimethylolpropane trithioglycolate, pentaerithritol ether, ethylene bis(3-pentaerithritol)tetrathioglycolate, ethylene bis(3-mercaptopropionate) and trimethylolpropane tri-3-mercaptopropionate.

21. The multilayered article defined in claim 13 which contains a third layer comprising a flexible support material.

22. The multilayered article defined in claim 13 wherein the first layer comprises an elastomeric polymer of butadiene-acrylonitrile rubber, the ethylenically unsaturated monomer is trimethylolpropane triacrylate, the initiator activatable by actinic radiation is benzophenone, and the elastomeric backing layer comprises the reaction product resulting from partially photocuring the product of the reaction of an MDI tipped polyester polyol with 2hydroxyethyl acrylate using benzophenone or 2-2-dimethoxy-2-phenylacetophenone as the photoinitiator.

23. The multilayered article defined in claim 22 wherein the elastomeric backing layer comprises the reaction product resulting from partially photocuring a vinyl terminated butadiene-acrylonitrile oligomer having a specific gravity of 0.962 and a viscosity of 200,000 cp at 27° C. using benzophenone or 2,2-dimethoxy-2-phenylacetophenone as the photoinitiator.

24. The multilayered article defined in claim 22 wherein the elastomeric backing layer comprises the reaction product resulting from partially photocuring the product of the reaction of an ethylene oxide tipped copolymer of ethylene oxide and propylene oxide with toluene diisocyanate and 2-hydroxyethylacrylate at the molar ratio of reactants of approximately 1:2:2 in admixture with actinic radiation activatable amounts of 2,2-dimethoxy-2-phenylacetophenone or benzophenone.

* * * * *

UNITED STATES PATENT AND TRADEMARK OFFICE
CERTIFICATE OF CORRECTION

PATENT NO. : 4,264,705
DATED : April 28, 1981
INVENTOR(S) : Richard B. Allen

It is certified that error appears in the above—identified patent and that said Letters Patent is hereby corrected as shown below:

In Claim 4, line 1, "mulfilayered" should read
-- multilayered --.

In Claim 22, line 9, "2hydroxyethyl" should read
-- 2-hydroxyethyl --.

Signed and Sealed this

Eighteenth Day of August 1981

[SEAL]

Attest:

Attesting Officer

GERALD J. MOSSINGHOFF

Commissioner of Patents and Trademarks